United States Patent
Young et al.

(10) Patent No.: US 7,659,665 B2
(45) Date of Patent: Feb. 9, 2010

(54) OLED DEVICE WITH METAL FOIL

(75) Inventors: Edward Willem Albert Young, Eindhoven (NL); Adrianus Sempel, Eindhoven (NL); Piet Snijder, Eindhoven (NL); Herbert Friedrich Boerner, Aachen (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 259 days.

(21) Appl. No.: 11/816,103

(22) PCT Filed: Feb. 7, 2006

(86) PCT No.: PCT/IB2006/050396

§ 371 (c)(1), (2), (4) Date: Aug. 13, 2007

(87) PCT Pub. No.: WO2006/087653

PCT Pub. Date: Aug. 24, 2006

(65) Prior Publication Data

US 2008/0265754 A1    Oct. 30, 2008

(30) Foreign Application Priority Data

Feb. 16, 2005    (EP)    ................... 05101161

(51) Int. Cl.
*H01J 1/62*    (2006.01)
*H01J 63/04*    (2006.01)

(52) U.S. Cl. .................. 313/506; 313/504; 313/512

(58) Field of Classification Search .................. 313/504, 313/506, 512, 503, 505; 428/690
See application file for complete search history.

(56) References Cited

U.S. PATENT DOCUMENTS

| 4,767,679 | A | * | 8/1988 | Kawachi ..................... 428/690 |
| 5,488,266 | A | * | 1/1996 | Aoki et al. .................. 313/509 |
| 6,433,358 | B1 | | 8/2002 | Beierlein |
| 6,737,753 | B2 | * | 5/2004 | Kumar et al. ............... 257/787 |
| 6,773,832 | B2 | * | 8/2004 | Sotoyama et al. .......... 428/690 |
| 2002/0117663 | A1 | | 8/2002 | Beierlein |
| 2004/0108811 | A1 | | 6/2004 | Klausmann et al. |
| 2004/0119403 | A1 | * | 6/2004 | McCormick et al. ........ 313/506 |
| 2005/0023965 | A1 | * | 2/2005 | Maeda et al. ............... 313/504 |
| 2005/0023970 | A1 | | 2/2005 | Maeda et al. |
| 2005/0258437 | A1 | * | 11/2005 | Young ......................... 257/83 |
| 2005/0269943 | A1 | | 12/2005 | Hack et al. |

FOREIGN PATENT DOCUMENTS

| WO | 9966568 | | 12/1999 |
| WO | 2004023575 | A1 | 3/2004 |

* cited by examiner

*Primary Examiner*—Peter J Macchiarolo
*Assistant Examiner*—Glenn Zimmerman

(57) ABSTRACT

An OLED device includes a substrate, electrode layers and organic layers arranged on the substrate and at least one metal foil on top thereof. The first metal foil is electrically connected to one of the electrode layers. An enclosure of at least the organic layers is provided by the metal foil in conjunction with a sealant 113. Thus, the metal foil plays a major role in forming an OLED package. In addition, the metal foil provides a low ohmic external connection, which for example can be used for applying a driving current to the OLED.

13 Claims, 4 Drawing Sheets

OLED DEVICE WITH METAL FOIL

FIELD OF THE INVENTION

The present invention relates to an OLED (Organic Light Emitting Diode) device comprising a substrate, a first conducting layer overlying the substrate, a set of organic layers overlying the first conducting layer, and a second conducting layer overlying the set of organic layers. The layers are structured such that a plurality of pixels are formed thereby on the substrate.

BACKGROUND OF THE INVENTION

OLED devices require a moisture and oxygen free environment in order to protect the organic layers and ensure a long lifetime of the device. Consequently the OLEDs must be hermetically enclosed. A typical packaging method is disclosed in the patent application US 2004/0108811, where a cap is arranged above the OLEDs and is sealed against the substrate. Such a conventional package is cheap and easy to build, while causing the package to be relatively thick and rigid. Additionally such a conventional package suffers from mechanical problems. In particular large area packages that are exposed to low ambient pressure and temperature fluctuations are prone to failure. Additionally, the conventional package does not support electrical current transport towards the device.

SUMMARY OF THE INVENTION

An object of the present invention is to provide an OLED device packaging solution that alleviates the problems of prior art mentioned above.

Thus, in accordance with an aspect of the present invention the OLED device comprises a substrate, a first conducting layer overlying the substrate, a set of organic layers overlying the first conducting layer, a second conducting layer overlying the set of organic layers, and a first metal foil arranged on top of the second conducting layer. At least a portion of the first conducting layer constitutes a bottom electrode layer. At least a portion of the second conducting layer constitutes a top electrode layer. The first metal foil is electrically connected to one of said bottom and top electrode layers. An enclosure of at least the set of organic layers is provided by the first metal foil in conjunction with a sealant.

The metal foil has the double function of forming a flexible package together with the sealant and providing a good conductivity support for one of the electrode layers.

According to an embodiment of the OLED device, a second metal foil is arranged. The first and second metal foils are typically, but not necessarily, connected to different electrode layers for providing a good conductivity support for both electrode layers.

According to an embodiment of the OLED device, the contact portions open up for many different connection options for the second metal foil.

According to an embodiment of the OLED device, the device comprises three or more metal foils. This implies that at least two metal foils are connected to the same electrode layer. This is useful in many different applications.

For example, according to an embodiment of the OLED device, individual pixel or pixel group control is achievable. Examples of applications employing such control are white light devices where pixel groups of different colours are used; addressing of different pixel groups of icons; and tuning the colour temperature of the emitted light in accordance with customer desires.

Thus, in accordance with the invention the package comprises one or more metal foils, where all of them contribute more or less to the tightness of the package.

According to an embodiment of the OLED device, applications based on differently coloured pixels can be provided.

According to an embodiment of the OLED device, a very compact device is obtained, having a thickness close to that of OLED devices having a cap formed of a layer that is deposited on the top electrode layer, as disclosed in US 2002/0117663. The latter technique is however considerably more expensive and does not provide the function of a low resistivity connection for at least one electrode layer.

According to an embodiment of the OLED device as defined in claim 8, an advantageous connection structure is obtained.

BRIEF DESCRIPTION OF THE DRAWINGS

The invention will now be described in more detail and with reference to the appended drawings in which.

DESCRIPTION OF PREFERRED EMBODIMENTS

Figure 1:
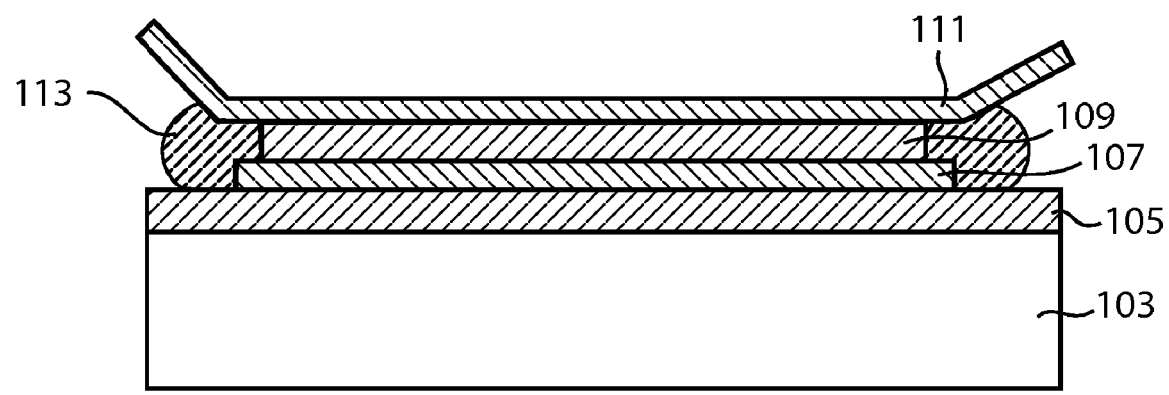
FIGS. 1-4 in cross-sectional views schematically show different embodiments of the OLED device according to the present invention.

An OLED device according to a first embodiment of this invention, as shown in FIG. 1, comprises a substrate 103, a first conducting layer, constituting a bottom electrode layer, 105 overlying the substrate 103, a set of organic layers 107 overlying the bottom electrode layer 105, and a second conducting layer, constituting a top electrode layer 109 overlying the set of organic layers 107. In this embodiment the bottom electrode layer 105 is an anode and the top electrode layer 109 is a cathode. On top of the top electrode layer 109 a metal foil 111 is arranged. A sealant in the form of glue strings 113 is applied between the foil 111 and the top surface of the anode 105. Thus a hermetic enclosure of the intermediate layers 107, 109 is obtained. The foil 111 is in direct contact with the cathode 109, and provide for a low ohmic connection of driving circuitry to the cathode. It is to be noted that the resistivity of the metal foil, typically having a thickness of some tens of microns, is in the order of 0.001 ohm/square. In comparison, plated metal, typically having a thickness of about 5 micron, has a resistivity of about 0.01 ohm/square; Al thin film, typically having a thickness of 500 nm, has a resistivity of about 0.1 ohm/square; and ITO has a resistivity of about 15 ohm/square. Because the foil 111 is arranged on top of the top electrode layer, it is possible to have it cover substantially the whole area of the device. That is, the area of the foil 111 is approximately equal to the area of the substrate 103.

The OLED device can have a plurality of pixels arranged on the substrate 103, wherein each pixel comprises a portion of said bottom electrode layer, said organic layers and said top electrode layer. FIG. 1 shows but a portion of the device constituting one pixel. In this embodiment, the sealant 113 can be provided such that a hermetic package is obtained for each individual pixel.

Since the device is emitting through the substrate 103, the substrate preferably is made of glass and the anode 105 preferably is made of a commonly used transparent material, such as ITO (Indium Tin Oxide). The cathode 109 is made of any commonly used metal. The electrode and organic layers 105, 107, 109 generally are deposited by means of any commonly used technology. The foil preferably is made of Copper, while other low resistivity metals are also possible to use.

Figure 2:
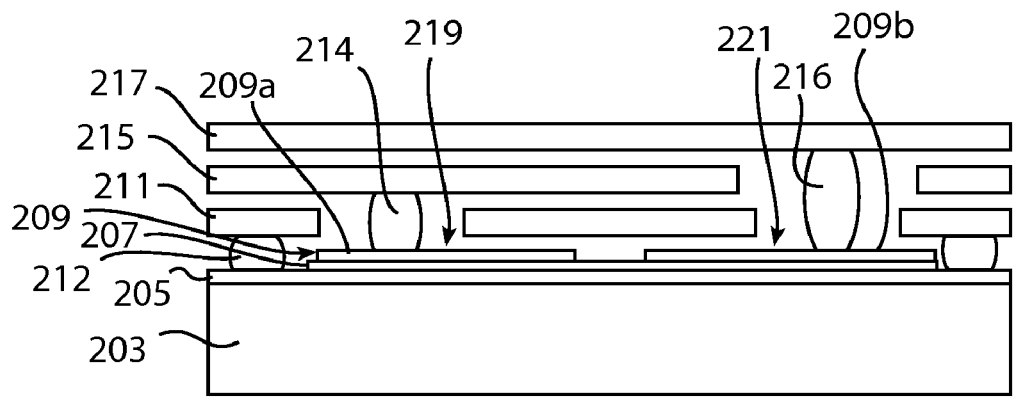

In FIG. 2 a portion of an OLED device having a plurality of metal foils is shown. In this figure two pixels are shown. The structure shown is typical for a simple single colour device, such as a display having monochrome icon addressing. This embodiment comprises a substrate 203, a bottom electrode layer 205, applied as a blanket metallization, which thus is common for all pixels, a set of organic layers 207, which set is also common for all pixels, and a top electrode layer 209, which is divided into separate portions 209a, 209b, one for each individual pixel, such as a first pixel 219 and a second pixel 221 respectively, shown in FIG. 2. The bottom electrode layer 205 is an anode, and the top electrode layer 209 is a cathode.

The device further comprises a first metal foil 211, arranged on top of but separated from the top electrode layer 209, a second metal foil 215, on top of and separated from the first metal foil 211, and a third metal foil 217, on top of and separated from the second metal foil 215. An insulating foil is arranged beneath each metal foil 211, 215, 217, although not shown in the figure due to reasons of clarity. The insulating foils are preferably made of polyamide. However, there are many useful alternative materials, such as Teflon® based foils and liquid crystal polymers. First connection portions 212, preferably strings of a conductive material, connect the first foil 211 with the anode 205. Second connection portions 214 connect the second foil 215 with the cathodes, i.e. cathode portions, of a subgroup of the pixels including the cathode portion 209a of the first pixel 219. Third connection portions 216 connect the third foil 217 with the cathodes of another subgroup of the pixels, including the cathode 209b of the second pixel 221. With this structure it is possible to address individual pixel groups.

Figure 3:
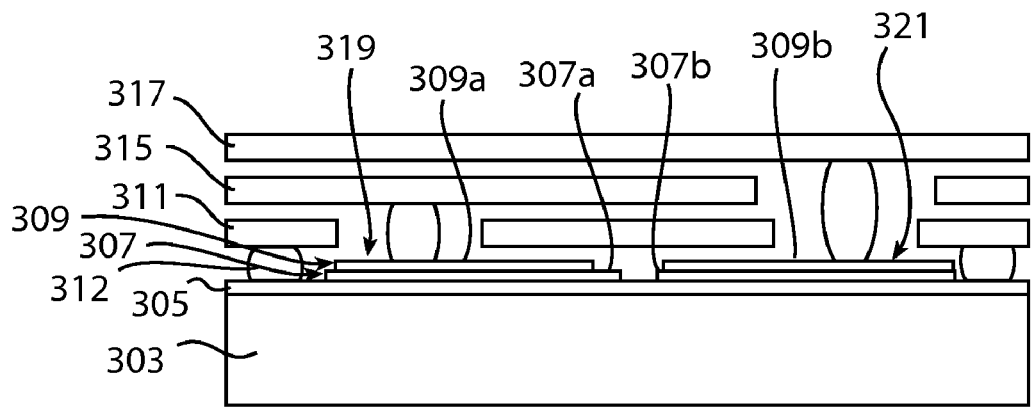

In FIG. 3 a more complex structure is shown. The difference from the structure of FIG. 2 is that the set of organic layers is divided into separate portions, one for each pixel, as well, such as a first pixel 319 and a second pixel 321, respectively. Thus, an anode 305 overlay a substrate 303, a set of organic layers 307 overlay the anode 305, and is divided into organic layer pixel portions 307a, 307b, a cathode 309 overlay the set of organic layers 307, and is divided into cathode pixel portions 309a, 309b corresponding to the organic layer pixel portions 307a, 307b of the set of organic layers 307, and first, second and third metal foils 311, 315, 317 are stacked on top of the cathode 309 with insulating foils in between. Connection portions are arranged in the same way as in the embodiment shown in FIG. 2.

With the embodiment of FIG. 3, it is possible to build a multi colour device, for example for the above-mentioned applications, such as a white light emitter.

Figure 4:
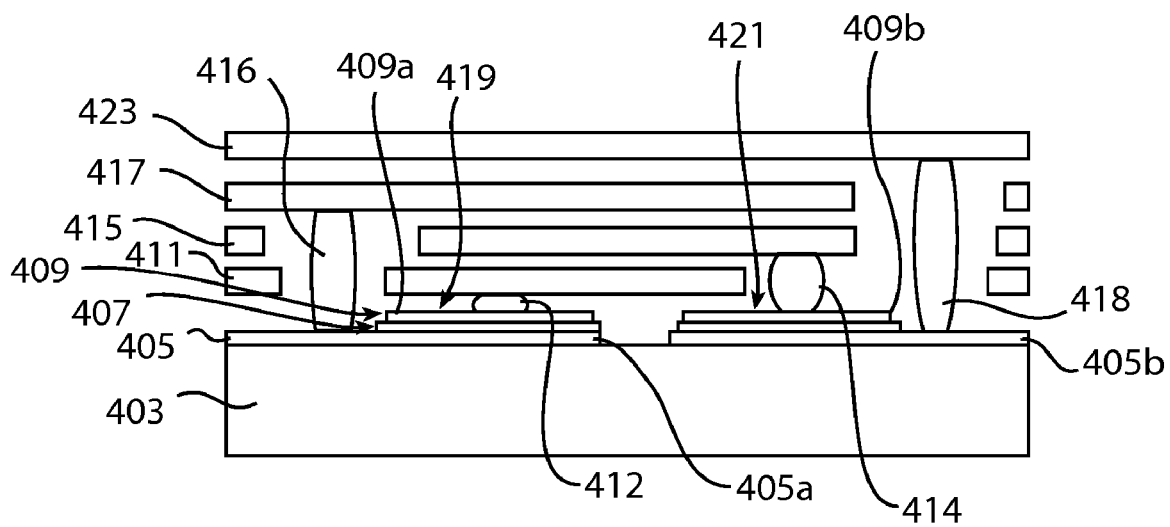

In FIG. 4 a further embodiment is shown. This embodiment corresponds to that of FIG. 3 except for the anode layer that is divided into separate portions 405a and 405b one for each pixel the existence of a fourth metal foil and slightly differently connected foils. Thus, the device has a substrate 403, an anode 405 on top of the substrate 403, a pixilated set of organic layers 407 and cathode 409 on top of the anode 405, and first, second, third and fourth metal foils 411, 415, 417 and 423 stacked thereon. The first foil 411 is connected via connection portions 412 to the cathodes of a first subgroup of pixels including the cathode 409a of a first pixel 419 as shown. The second foil 415 is connected by means of connection portions 414 to the cathodes of a second subgroup of pixels including the cathode 409b of a second pixel 421 as shown. The third foil 417 is connected via connection portions 416 to the anodes of the first subgroup of pixels, including the anode 405a of the first pixel 419. The fourth foil 423 is connected via connection portions 418 to the anodes of the second subgroup of pixels including the anode 405b of the second pixel 421.

With this structure it is possible to provide a multi colour device with segmented display features.

Figure 5:
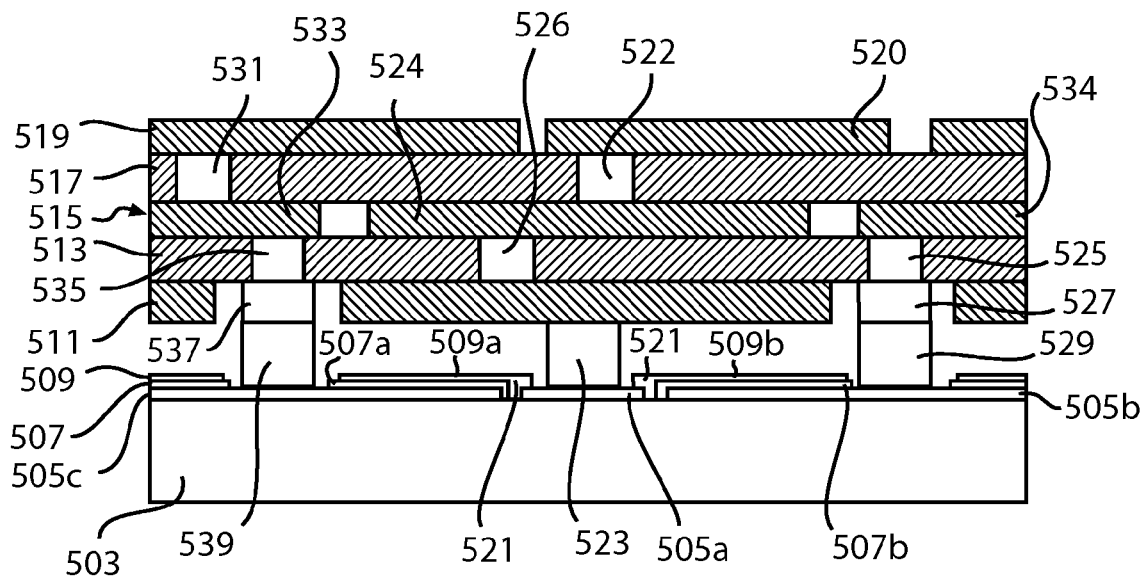
FIG. 5 in a cross-sectional view schematically shows the structure of an embodiment of the device in more detail.

In FIG. 5 a portion of 3-foil device having both anode and cathode connections at the top metal foil is shown in more detail. An ITO layer divided into portions 505a-c is deposited on the substrate 503. Organic layers 507 divided into portions comprising first and second portions 507a-b are deposited on the ITO layer portions 505a-c. A cathode layer 509 divided into portions comprise first and second cathode portions 509a-b deposited on the organic layer first and second portions 507a-b. A first metal foil 511 is arranged above and distanced from the cathode layer 509. A first insulating foil 513 is arranged on top of the first metal foil 511. A second metal foil 515 is arranged on top of the first insulating foil 513. A second insulating foil 517 is arranged on top of the second metal foil 515. A third metal foil 519 is arranged on top of the second insulating foil 517.

A first ITO portion 505a is connected to the cathode layer 509 via bridging portions 521 of the cathode layer extending past the organic layers 507 between the cathode layer 509 and the ITO layer, i.e. protruding downwards from the cathode layer 509. The first metal foil 511 is connected to the first ITO portion 505a via a connection portion 523 consisting of a suitable ITO copper interconnect, for instance ACF (Anisotropic Conductive Film). Further, the first metal foil 511 is connected to a separate portion 520 of the third metal foil 519 by means of a via portion 522 through the second insulating foil 517, a separate portion 524 of the second metal foil 515, and a via portion 526 through the first insulating foil 513. A major portion 534 of the second metal foil 515 is connected by means of a via portion 525 in the first insulating foil 513, a separate portion 527 of the first metal foil 511, and an ACF portion 529 to the second ITO portion 505b, which act as an anode. A further connection, similar to the one just described, between the major portion 534 of the second metal foil 515 and another portion 505c of the anode is shown at 535, 537 and 539. The third metal foil 519 is connected to the first ITO portion 505c by means of a via portion 531 through the second insulating foil 517, a separate portion 533 of the second metal foil 515, a via portion 535 through the first insulating foil 513, a separate portion 537 of the first metal foil 511 and an ACF portion 539.

Thus, in this embodiment the bottom conductive layer (ITO) is divided into at least two anode planes and one or more separate portions, which are used as intermediate contact elements between the first metal foil and the cathode. This solution for connecting the first metal foil to the cathode is advantageous in that only one type of interconnect technology is used throughout the OLED device, i.e. interconnect between ITO and Copper. By using ACF for this interconnect, a well known interconnect technology is applied. The use of an anisotropic interconnect also provide further ease of fabrication. If for instance anode and cathode connections are arranged in line, one line of interconnect foil can be used for both contacts. Other interconnection solutions are useful as well, although they may be less desirable.

Figure 6:
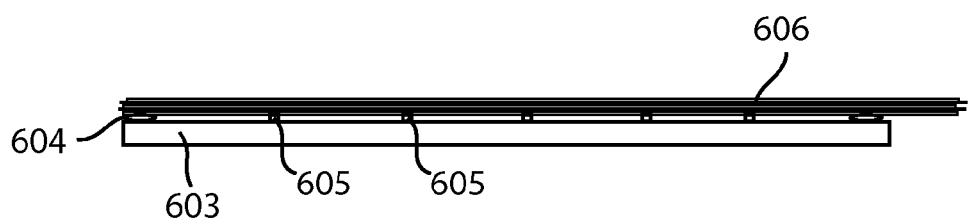
FIG. 6 is an overall view of the embodiment in FIG. 5.

FIG. 6 is an overall view of the just-described embodiment. Here it is shown that, in this embodiment, the sealant 604 is limited to edge portions of the substrate 603. The stack of metal foils and insulating foils is shown schematically at 606, and the ACF portions 605 are shown between the substrate 603 and the stack 606.

Figure 7:
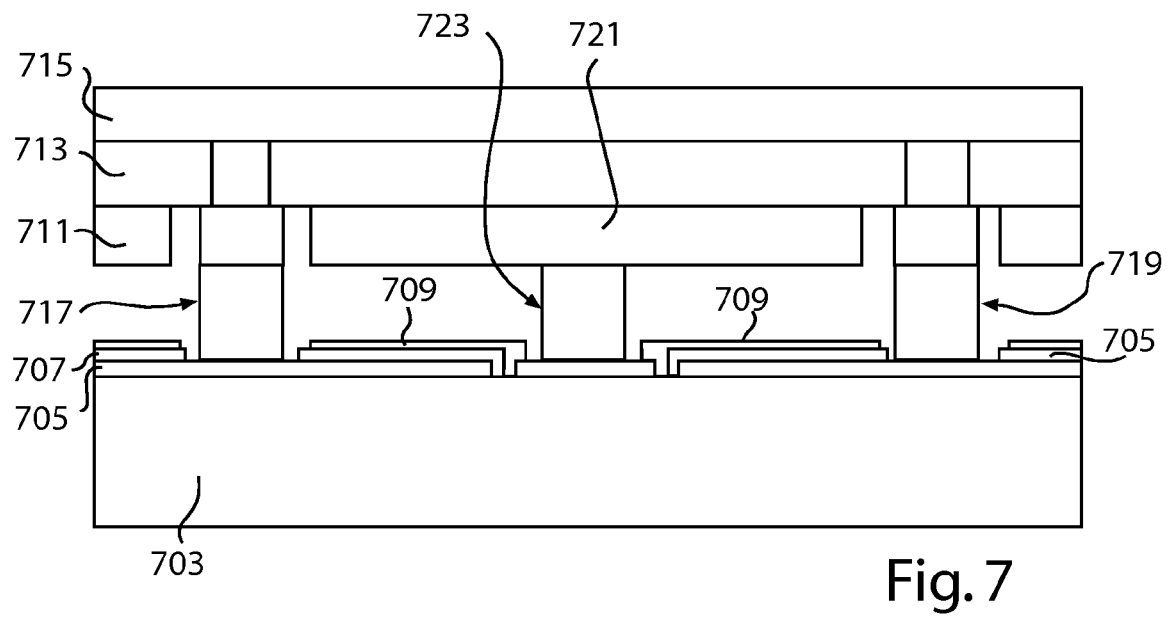
FIG. 7 in a cross-sectional view schematically shows the structure of another embodiment of the device in more detail.

In FIG. 7 a portion of a 2-foil device having anode connections at the top metal foil and cathode connections to the bottom metal foil is shown in more detail. Since the principles for the connection portions are the same as already explained, only a brief explanation of this figure will be made.

The OLED device comprises a substrate 703, a bottom electrode layer 705, a set of organic layers 707, a top electrode layer 709, a first metal foil 711, an insulating foil 713, and a second top most metal foil 715.

A portion 721 of the first metal foil 711 is connected to the cathode layer 709 via a connection portion 723 comprising an ACF portion, a separate portion of the bottom electrode layer 705, and bridging portions past the organic layers 707. The second metal foil 715 is connected via connection portions 717, 719, in a similar way as the second foil of the 3-foil embodiment shown in FIG. 5 to the bottom electrode layer 705, and more particularly to the major portion thereof constituting the anode.

Figure 8:
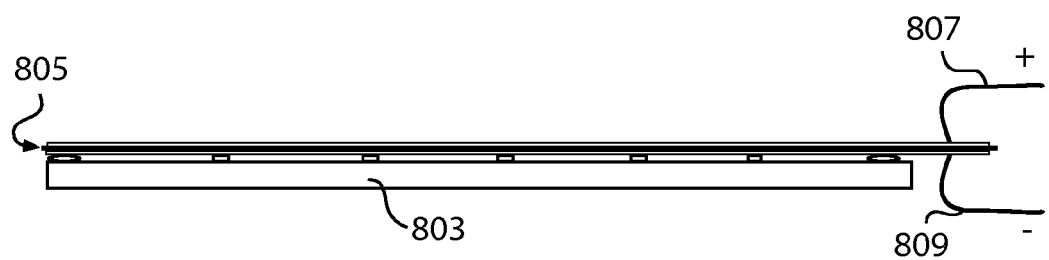
FIG. 8 is an overall view of the embodiment in FIG. 7.

In FIG. 8 the embodiment of FIG. 7 is also shown, though in an overall view. The substrate is denoted 803 and the structure arranged on the substrate is denoted 805. External connections 807, 809 are schematically illustrated, where an electrically positive connection 807 is attached to the top electrode layer and an electrically negative connection 809 is attached to the bottom electrode layer.

Above, embodiments of the OLED device according to the present invention have been described. These should be seen as merely non-limiting examples. As understood by those skilled in the art, many modifications and alternative embodiments are possible within the scope of the invention.

It is to be noted, that for the purposes of this application, and in particular with regard to the appended claims, the word "comprising" does not exclude other elements or steps, that the word "a" or "an", does not exclude a plurality, which per se will be apparent to those skilled in the art.

Thus, in accordance with the present invention, there is provided an OLED structure having at least one metal foil on top of the electrode and organic layers arranged onto the substrate. The metal foil(s) is(are) used for a combination of providing low resistivity connections for external connectors to one of or, preferably, both the electrodes, and providing a package that is tight and flexible. The invention is particularly useful for driving large area OLEDs.

The invention claimed is:

1. An OLED device comprising:
a substrate;
a first conducting layer overlying the substrate;
a plurality of organic layers overlying the first conducting layer;
a second conducting layer overlying the plurality of organic layers; and
a first metal foil arranged on top of the second conducting layer,
wherein the first conducting layer includes at least a portion that constitutes a bottom electrode layer and a separate portion separated from the bottom electrode layer, and wherein at least a portion of the second conducting layer constitutes a top electrode layer, and wherein the first metal foil is electrically connected to the top electrode layer through the separate portion of the bottom electrode layer, and wherein the first metal foil provides an enclosure for at least the plurality of organic layers.

2. The OLED device according to claim 1, further comprising a second metal foil arranged on top of said first metal foil and electrically connected to one of said bottom and top electrode layers, and an insulating layer arranged between said first and second metal foils.

3. The OLED device according to claim 2, wherein contact portions are provided between the second metal foil and the bottom electrode layer through said insulating layer and said first metal foil.

4. The OLED device according to claim 2, further comprising a further metal foil arranged on top of another metal foil, wherein an insulating layer is arranged between the further metal foil and the another metal foil.

5. The OLED device according to claim 2, further comprising a plurality of pixels, wherein each pixel comprises a portion of said bottom electrode layer, said organic layers and said top electrode layer, and wherein at least two different metal foils are electrically connected to different portions of the same electrode layer for individual control of different subgroups of pixels, wherein each subgroup comprises at least one pixel.

6. The OLED device according to claim 5, wherein said different subgroups of pixels emit differently colored light.

7. The OLED device according to claim 1, wherein said first metal foil is arranged directly upon the top electrode layer.

8. The OLED device according to claim 1, wherein the separate portion of the bottom electrode layer is connected to the top electrode layer via bridging portions of the top electrode layer extending past the plurality of organic layers.

9. The OLED device according to claim 8, wherein the metal foil provides external connection terminals.

10. The OLED device of claim 1, wherein the first metal foil forms external connection terminals for applying a driving current to the OLED.

11. The OLED device of claim 1, further comprising a plurality of metal foils formed over the first metal foil, wherein the plurality of metal foils are separated from each other by insulating layers.

12. The OLED device of claim 1, further comprising an insulating layer arranged between the first metal foil and one of a plurality of metal foils.

13. The OLED device of claim 1, wherein a resistivity of the first metal foil is substantially 0.001 ohm/square.

* * * * *